United States Patent [19]

Krueger

[11] 4,039,958
[45] Aug. 2, 1977

[54] CIRCUITS FOR DECODING PULSE SIGNALS

[75] Inventor: Paul C. Krueger, Wharton, N.J.

[73] Assignee: The United States of America as represented by the Secretary of the Army, Washington, D.C.

[21] Appl. No.: 756,519

[22] Filed: Jan. 3, 1977

Related U.S. Application Data

[62] Division of Ser. No. 682,882, May 3, 1976.

[51] Int. Cl.² .................. H03K 13/00; H03K 5/20
[52] U.S. Cl. .................. 328/119; 307/232;
   307/234; 328/110; 328/112
[58] Field of Search ........ 328/119, 109, 110, 111-112;
   307/232, 234

[56] References Cited

U.S. PATENT DOCUMENTS

| | | | |
|---|---|---|---|
| 3,667,054 | 5/1972 | Nelson | 328/111 |
| 3,818,358 | 6/1974 | Russell | 307/234 |
| 3,940,764 | 2/1976 | Beeswing | 328/110 |
| 3,942,125 | 3/1976 | Horiuchi | 328/119 |

*Primary Examiner*—Stanley D. Miller, Jr.
*Attorney, Agent, or Firm*—Nathan Edelberg; A. Victor Erkkila; Thomas R. Webb

[57] ABSTRACT

A decoding circuit comprises: a gated oscillator, designed to generate a square-wave pulse train having a long first positive pulse followed by short spaces and short positive pulses, having its output connected to the clock input of an oscillator counter and its control input connected to the output of a flip-flop; a signal input terminal connected to the SET input of the flip-flop and also to the clock input of a signal counter; a first three-input AND gate having two inputs connected, respectively, in opposite phase to the first count outputs of the two counters and its third input connected through an inverter to the oscillator output; means connecting the gate output to RESETS of the flip-flop and the two counters; a second three-input AND gate having two inputs connected, respectively, in opposite phase to the Nth count outputs of the two counters and the third input connected directly to the oscillator output; means connecting the second gate output to the RESETS of the flip-flop and counters; a third three-input AND gate having two inputs connected, respectively, directly to the Nth count outputs of the counters and the third input connected directly to the oscillator output; and an output terminal connected to the output of the third gate.

In a modified decoding circuit, the gated oscillator is replaced by a modified oscillator, designed to generate a square-wave pulse train having a long first negative pulse followed by short positive pulses and spaces, and the first and second AND gates are replaced by NOR gates, with suitable inverter changes.

10 Claims, 12 Drawing Figures

CIRCUITS FOR DECODING PULSE SIGNALS

GOVERNMENTAL INTEREST

The invention described herein may be manufactured, used and licensed by or for the Government for governmental purposes without the payment to me of any royalty thereon.

This is a division of application Ser. No. 682,882 filed May 3, 1976.

BACKGROUND OF SUMMARY OF THE INVENTION

The present invention relates to new and improved circuits for decoding electrical pulse signals.

It is sometimes desirable to encode an electrical signal for transmission over wire, optical or ratio link so that it can be separated from noise or other spurious signals that may be present. Applications include enabling, arming or firing a weapon system in which such conditions exist. For example, consider a complex missile system where frequent electrical testing may be expected while the weapon is in stockpile. The test signals must not initiate the warhead arming cycle. In addition, the warhead arming must be delayed after launch to provide the maximum protection to friendly personnel and territory. During this portion of flight, electrical currents and other signals may be present in the missile circuit performing warhead functions. The missile arming and fuzing system must be designed to protect against these stimuli affecting the warhead sub-system. Numerous methods of accomplishing this purpose have been developed and used. One method is to have an arming function dependent upon a "unique" signal that is neither a direct current nor a continuous alternating current. Such a signal should present some characteristic that would prevent confusion with a spurious signal.

A suitable unique signal is produced by modifying a pulse oscillator that is widely used in digital electronics and consists of three phase inverters connected in series, with a timing capacitor connected in parallel with the second inverter and a low-impedance feedback connection between the output of the third inverter and the input of the first inverter. This oscillator generates a pulse signal train consisting of pulses and spaces between pulses of uniform length (with times) and no identifiable starting time. The modification involves the substitution, for the third inverter, of either a NOR gate or a NAND gate having two inputs, one of which is connected to the output of the second inverter, and means for applying a control or gating signal to the other input. The modified oscillator produces a pulse train made up of a first pulses of given length followed by spaces and pulses of much shorter length, the unique features being the long first pulse.

The invention involves the provision of a new and improved decoding circuit including the new pulse oscillator, for generating a unique pulse train starting with a long first pulse and followed by short spaces and pulses, in combination with means for comparing the locally generated pulse train with a similar, but not necessarily identical, input signal pulse train, and either rejecting a spurious signal or accepting the signal and producing an output, for any purpose desired. The local oscillator is started by the first pulse of the incoming signal train, which could be the beginning of a true or desired signal. The decoding circuit further includes: two digital counters, one connected to the pulse oscillator and the other connected to the signal source; and either an AND gate or a NOR gate having two inputs connected, respectively, to the first counting outputs of the two counters in phase opposition, a third input connected to the oscillator, and an output connected to means for resetting the oscillator and the two counters in the event of a mismatch between the first pulses of the oscillator and signal pulse trains. The decoding circuit further includes a second inverting gate, which may be either an AND gate or a NOR gate, having two inputs connected, respectively, to the Nth counting outputs of the two counters in phase opposition, a third input connected to the oscillator, and an output connected to the resetting means, for rejecting the signal in the event of a mismatch between the Nth pulses of the signal and oscillator trains, and an output gate having two inputs connected, respectively, to the Nth counting outputs of the two counters in the same phase relationship, a third input connected to the oscillator, and an output connected to an output terminal, for accepting a matching signal and producing an output signal, which may, for example, be used to initiate an arming circuit for a munition fuze. In another example, the decoding circuit may be a part of a lock for a high security area, and the signal may be the key for opening the lock.

DETAILED DESCRIPTION OF THE PREFERRED EMBODIMENTS

Figure 1:
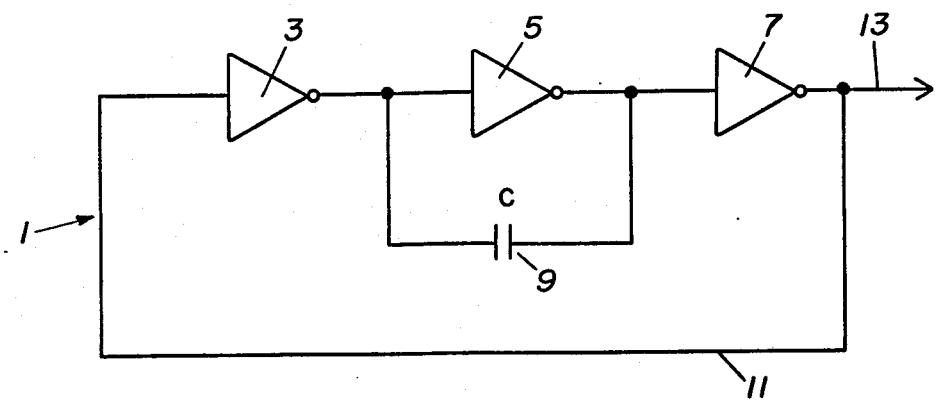
FIG. 1 is a logic circuit diagram of a known pulse generator or oscillator.

FIG. 1 shows a known pulse generating or oscillator circuit 1 comprising three phase inverting gates or inverters 3, 5 and 7 connected in series with each other, a wave-shaping capacitor 9 connected across the second inverter 5, a feed-back connection 11 between the third inverter 7 and the first inverter 3, and an output lead 13 connected to the output end of inverter 7. Each of the invertors 3, 5 and 7 may consist of an npn transistor and two associated resistors, such as transistor $Q_1$ and resistors $R_1$ and $R_2$ shown in the modified circuit of FIG. 4. The circuit 1 is unstable when energized, and will start oscillating to produce a pulse wave train such as that shown at 15 in FIG. 2. Wave train 15, which oscillates between logical ZERO ("0") and logical ONE ("1")

with time, is not suitable for coding purposes because the pulses are all alike, and there is no identifiable starting pulse.

Figure 2:
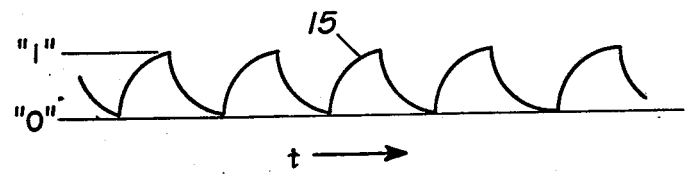
FIG. 2 is a graph showing the wave train generated by the oscillator of FIG. 1.
Figure 4:
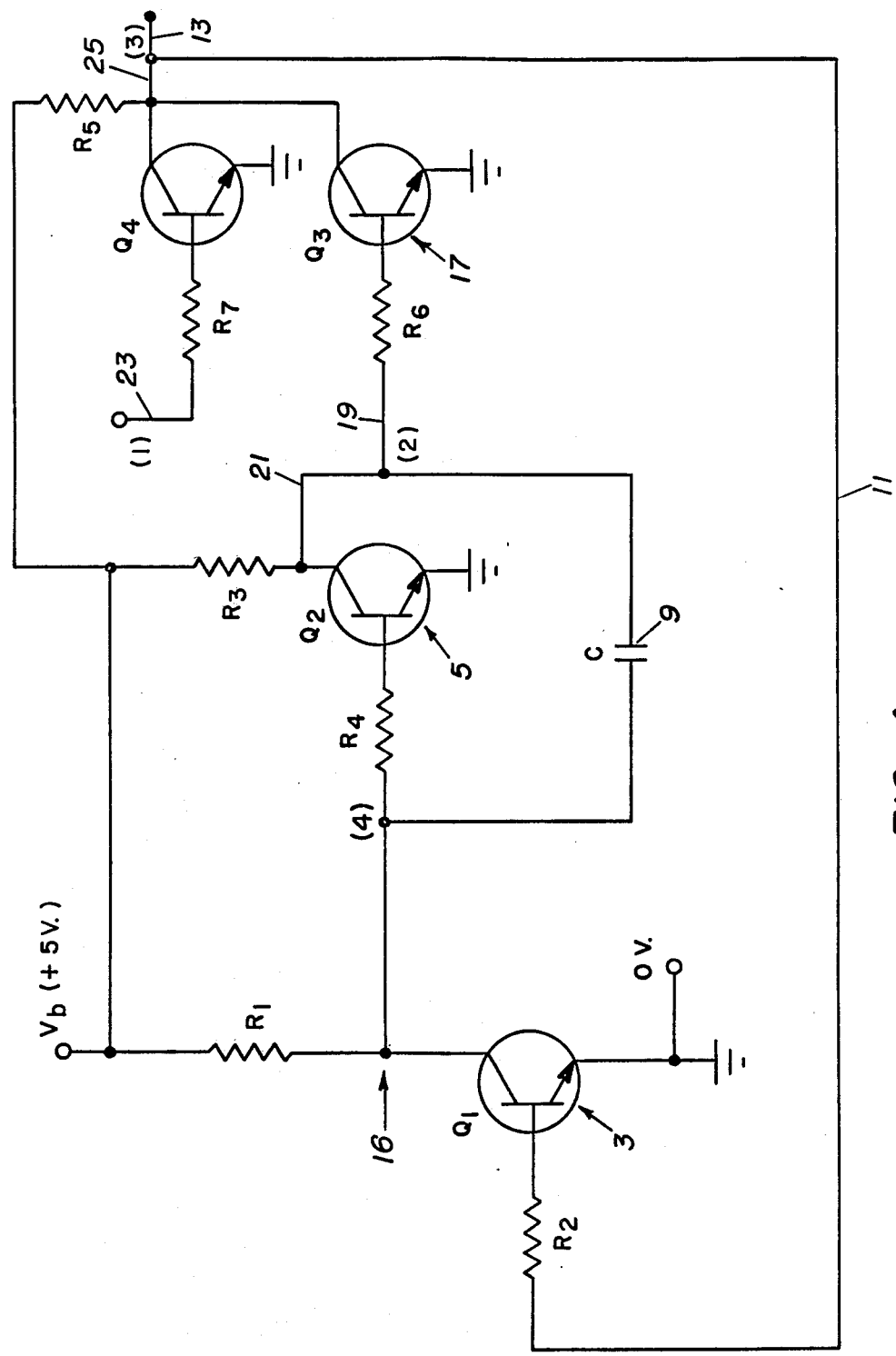
FIG. 4 is a detailed circuit diagram of the oscillator of FIG. 3.

The oscillator circuit 1 of FIG. 1 is modified, to produce the circuit 16 in FIG. 2, by replacing the third inverter 7 with a dual-input NOR gate 17 having one input 19 connected to the output 21 of the second inverter 5, another input 23 which serves as a control or gating lead, and an output 25 connected to output lead 13 and connection 11. As shown in detail in FIG. 4, the NOR gate 17 may comprise two npn transistors $Q_1$ and $Q_4$ with their collectors connected to output 25, their bases connected, through current-limiting base resistors $R_6$ and $R_7$, to inputs 19 and 23, respectively, and their emitters connected to ground (zero potential), and a load resistor $R_5$ connecting the collectors to a battery or other direct current voltge supply $V_b$ (e.g., +5 volts). FIG. 4 also shows the first inverter 3 as made up of an npn transistor $Q_1$ having its collector connected through a load resistor $R_1$ to $V_b$, its base connected through a base resistor $R_2$ to the feedback connection 11, and its emitter connected to ground; and the second inverter 5 as made up of an npn transistor $Q_2$ having its collector connected through a load resistor $R_3$ to $V_b$, its base connected through a base resistor $R_4$ to the collector of transistor $Q_1$ and to one side of capacitor 9, and its emitter connected to ground. Input 19 is connected to the collector of transitor $Q_2$ and to the other side of capacitor 9.

Figure 7:
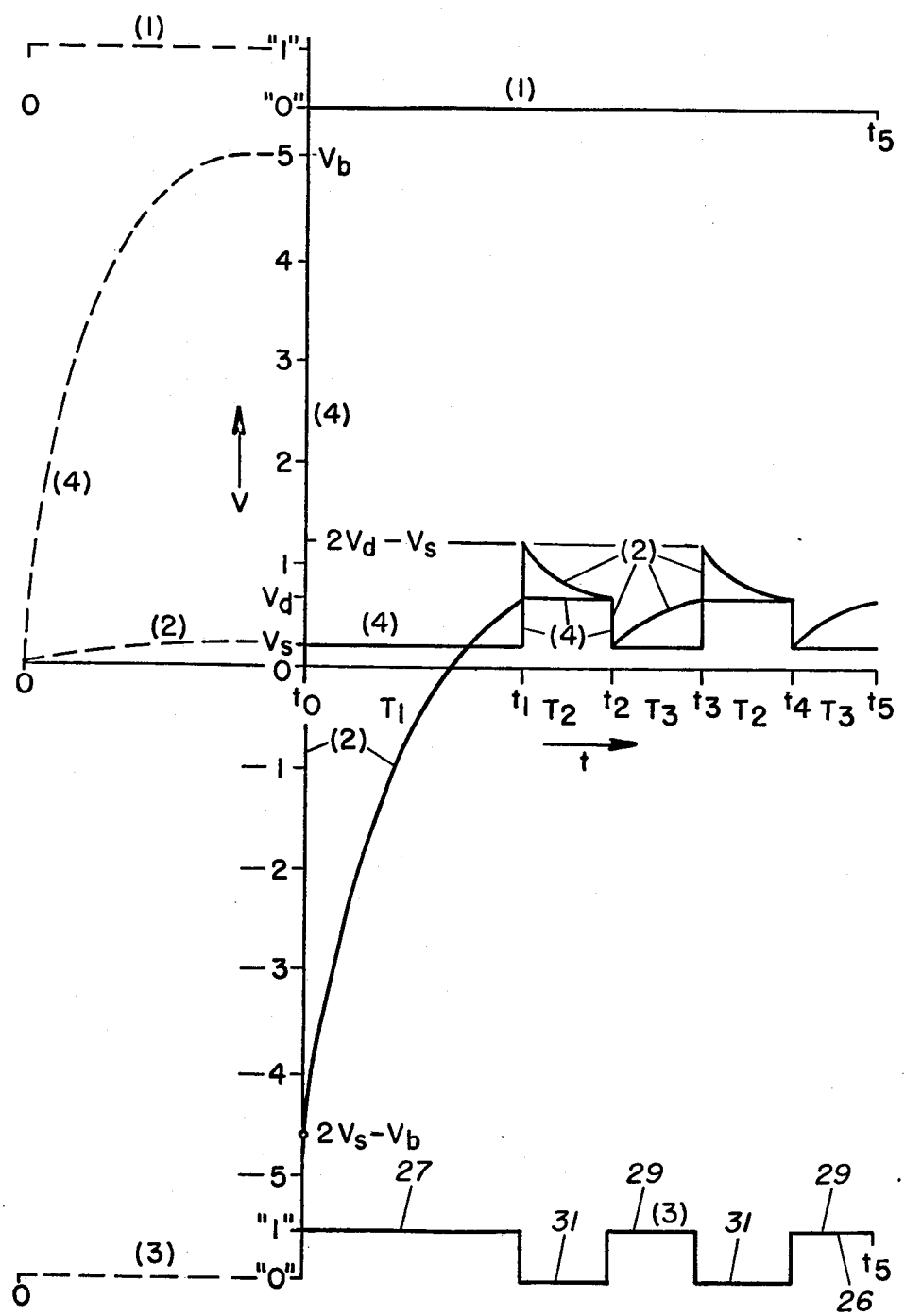
FIGS. 7 and 8 are graphs showing the wave trains generated by the oscillators of FIGS. 4 and 6, respectively.

The operation of the circuit 16 of FIGS. 3 and 4 will now be described, in connection with FIG. 7. For transistors $Q_1$ through $Q_4$ of the npn silicon type, for example, each transistor will start conducting when the voltage of the base relative to the grounded emitter is increased to about +0.7 volts and will stop conducting when the base voltage is reduced below that voltage. Thus, each inverter and the NOR gate will recognize 0 to about 0.7 volt as a logical "0" and any higher voltage as a logical "1." The base voltage at which the gate switches from a logical "0" to a logical "1" output will be designated $V_d$ and assumed to be the same for each of transistors $Q_2$ and $Q_3$. The wave forms labeled (1), (2), (3) and (4) in FIG. 7 represent the approximate voltages at the corresponding points in FIGS. 3 and 4 as a function of time $t$. At $t = 0$, a logical "1" is applied to input 23 of NOR gate 17, point (1), and the voltage source $V_b$ is turned on. The output (3) of the NOR gate 17 will be a "0," which is inverted by inverter 3 to a "1" at point (4), and inverted again by inverter 5 to a "0" at point (2). This does not change the output from NOR gate 17, with a "1" at point (1), so no oscillation occurs. The "1" at point (4) and the "0" at point (2) causes the capacitor 9 to charge up, through resistor $R_1$ and transistor $Q_2$, to the battery voltage $V_b$ (about +5 volts) at (4) and $V_s$ volt at point (2). The voltage $V_c$ across capacitor 9 is now $V_s - V_b = -4.8v$, considering a plus voltage at point (2) as positive. These voltages result from the very low voltage drop across resistor $R_1$ with the "0" input to transistor $Q_1$, and the high voltage drop across resistor $R_3$ with the "1" input to transistor $Q_2$. This assures that the transistors have high gain so that the base currents may be ignored. $V_s$ is te collector-to-emitter saturation voltage when the transistor is fully conducting. $V_s$ is usually about 0.2 volt and will be assumed to be the same for transistors $Q_1$ and $Q_2$. This charged condition will continue indefinitely, as shown by the dashed line (4) in FIG. 7, while input (1) remains a logical "1."

At some time $t = t_o$, input (1) is changed to a "0." This "0" switches point (3) to a "1," which causes transistor $Q_1$ to start conducting. Almost instantaneously, point (4) drops from $V_b$ to $V_s$. Since the voltage $V_c$ across capacitor 9 cannot change instantaneously, the voltage at point (2) goes down to $V_s - V_c$, which is $-4.6$ volts.

In a time $T_1$, from $t_o$ to $t_1$ in FIG. 7, point (2) charges to $V_d$ and $V_c$ becomes $V_d - V_s = +0.5v$. At time $t = t_1$, when point (2) becomes $V_d$ ("1"), NOR gate 17 switches its output (3) to a "0." This "0" causes point (4) to become a "1" ($V_d$). Again the voltage $V_c$ across the capacitor 9 cannot change instantaneously, so the voltage at point (2) becomes $V_d + V_c = 2V_d - V_s = +1.2v$.

In a time $T_2$, from $t_1$ to $t_2$ in FIG. 7, point (2) discharges from $2V_d - V_s$ to $V_d$, and $V_c$ become zero. At time $t = t_2$, point (2) is switched by transistor $Q_2$ to a "0," causing the NOR gate output (3) to switch to a "1." This "1" causes point (4) to become a "0," keeping $V_c$ at zero.

In a time $T_3$, from $t_2$ to $t_3$ in FIG. 7, point (2) charges to a "1," making $V_c = V_d - V_s$; and, at $t = t_3$, point (2) becomes a "1," causing output (3) to switch to a "0," at $t = t_1$. This causes point (4) to become a "1" and the voltage at point (2) again becomes $2V_d - V_s$. The operation from $t_3$ to $t_5$ is the same as that from $t_1$ to $t_3$. Thus, the circuit oscillates, producing at output (3) a square wave 26 (FIG. 7) having a first positive pulse 27 of length $T_1$, followed by a series of positive pulses 29 of length $T_3$ and intervening spaces 31 of length $T_2$.

Figures 5, 6:
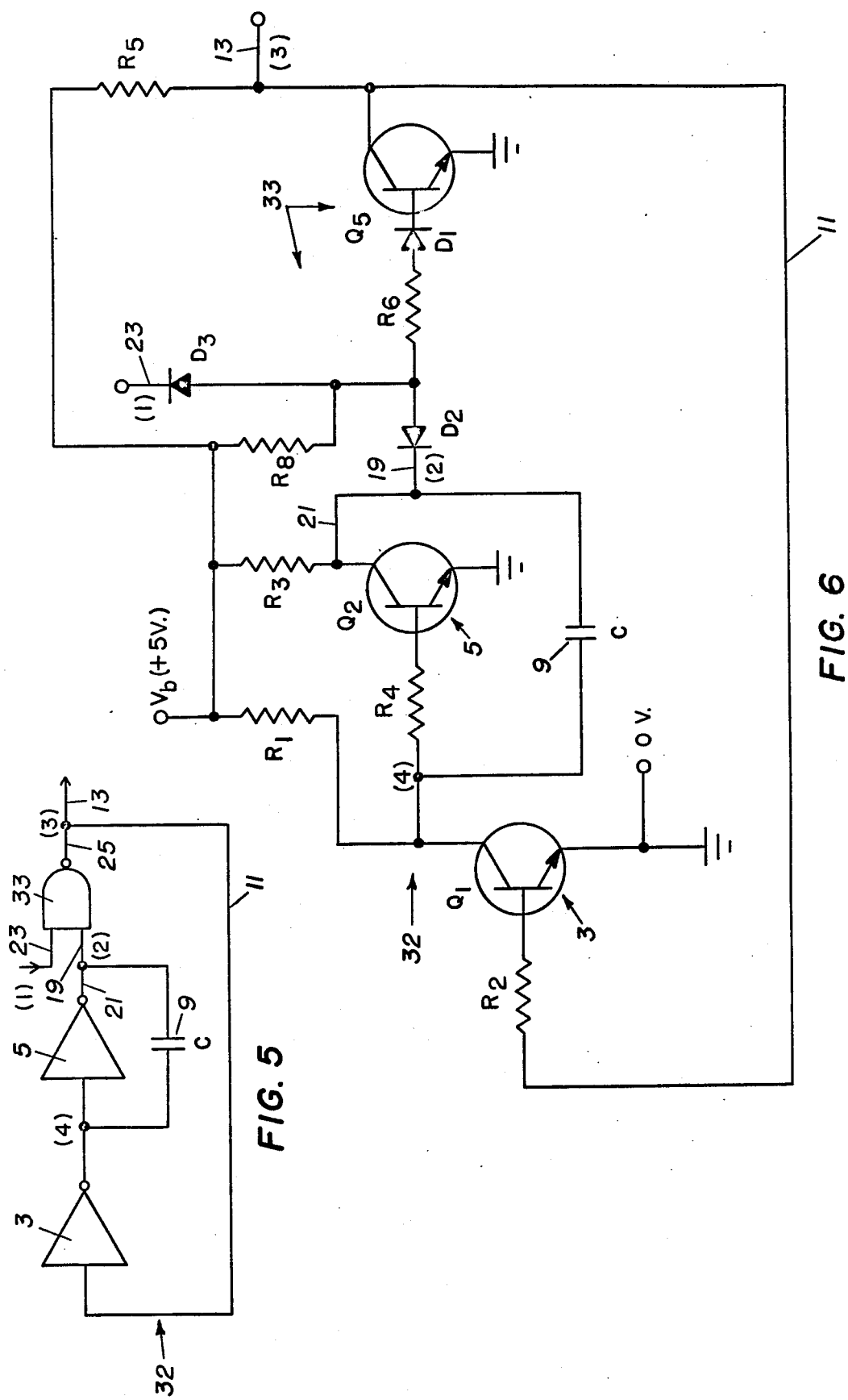
FIG. 5 is a logic circuit diagram of a modified oscillator.
FIG. 6 is a detailed circuit diagram of the oscillator of FIG. 5.

The charging or discharging time of the capacitor 9 through the associated resistor $R_1$ or $R_3$ in FIG. 6 is:

$$T = R\,C \log_e \frac{\text{Effective charge voltage}}{\text{Charge voltage} - \text{Capacitor voltage change}},$$

where $R$ is the resistance of resistor $R_1$ or $R_3$, $C$ is the capacitance of capacitor 9, and $\log_e$ is the natural logarithm. Thus, the charging time $T_1$ of the long first pulse 27 is:

$$T_1 = R_3\,C \log_e \frac{2(V_b - V_s)}{2(V_b - V_s) - (V_b + V_d - 2V_s)}$$

$$= R_3\,C \log_e \frac{2(V_b - V_s)}{V_b - V_d}.$$

The discharging time $T_2$ for each space 31 is:

$$T_2 = R_1\,C \log_e \frac{-(V_b - V_d)}{-(V_b - V_d) - (-[V_d - V_s])}$$

$$= R_1\,C \log_e \frac{V_b - V_d}{V_b - 2V_d + V_s}.$$

The charging time $T_3$ for each short pulse 29 is:

$$T_3 = R_3\,C \log_e \frac{V_b - V_s}{(V_b - V_s) - (V_d - V_s)}$$

$$= R_3\,C \log_e \frac{V_b - V_s}{V_b - V_d}.$$

In the example given, where $V_b = 5v.$, $V_d = 0.7v.$, and $V_s = 0.2v.$, the times $T_1$, $T_2$ and $T_3$ are:

$$T_1 = R_3\,C \log_e \frac{2(5 - .2)}{5 - .7} = .803\,R_3\,C;$$

-continued $$T_2 = R_1 C \log_e \frac{5 - .7}{5 - 1.4 + .2} = .124 \, R_1 C;  \text{ and}$$

$$T_3 = R_3 C \log_e \frac{5 - .2}{5 - .7} = .110 \, R_3 C.$$

Thus, if $R_1 = R_3$, $T_1/T_2 = 6.5$ $T_1/T_3 = 7.3$ $T_2/T_3 = 1.1$.

Since $$T_1 \sim 2 \frac{V_b - \text{a small number}}{V_b - \text{a small number}}, \text{ and}$$

$$T_2 \text{ and } T_3 \sim \frac{V_b - \text{a small number}}{V_b - \text{a small number}},$$

by choosing $V_s$ and $V_d$, one can make $T_1/T_2$ any desired ratio. The values of $V_d$ and $V_s$ depend upon the amount of doping of the transistor semiconductor material (e.g., silicon). It is desirable that $T_2$ and $T_3$ be nearly equal, and $T_1$ be large compared to $T_2$ and $T_3$. $T_2$ and $T_3$ approach zero ($\log_e 1 = 0$) and $T_1$ approached $R_3 C \log_e 2 = 0.693 R_3 C$.

If at any time the input (1) were changed back to a "1" in FIG. 4, the output at (3) would become a constant "0" (no oscillation), as before $t_o$.

The circuit 16 in FIG. 4 is a gated oscillator which generates a squarewave train comprising a distinct positive starting pulse of one length following by alternate negative or negative-going spaces and positive pulses of much shorter length, suitable for use as a coded signal.

Figure 3:
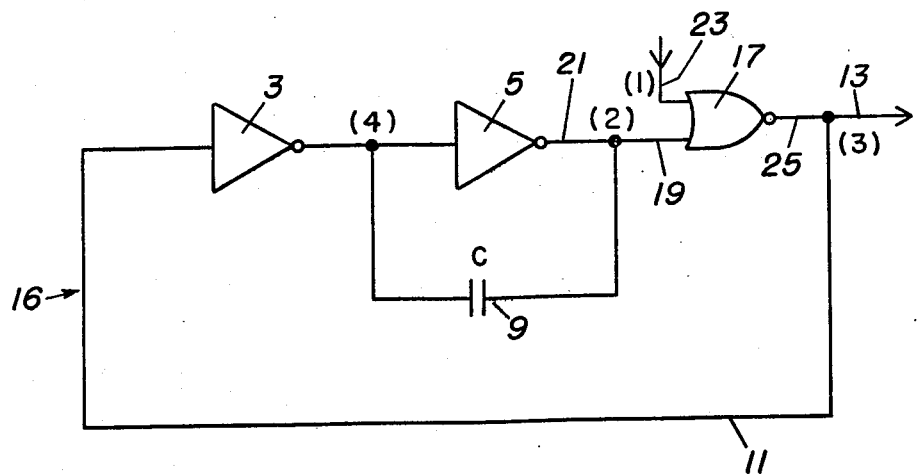
FIG. 3 is a logic circuit diagram of an improved pulse oscillator.

FIG. 5 shows a logic circuit, and FIG. 6 shows a detailed circuit, of an alternative modification 32 of FIG. 3 in which the third inverter 7 is replaced by a NAND gate 33. The same numerals and letters are applied to identical corresponding elements in FIGS. 3 through 6. As shown in FIG. 6, the NAND gate 33 may comprise an npn transistor $Q_5$ having its collector connected to the output lead 13 and through load resistor $R_5$ to the voltage supply $V_s$, and its base connected, through a first reversed diode $D_1$, a base resistor $R_6$ and a second reversed diode $D_2$, to input 19 (and output 21 of transistor $Q_2$). The control or gating input 23 is connected through a third reversed diode $D_3$ to the junction of resistor $R_6$ and diode $D_2$, and also through a load resistor $R_3$ to the voltage source $V_s$ ($V_b$).

Figure 8:
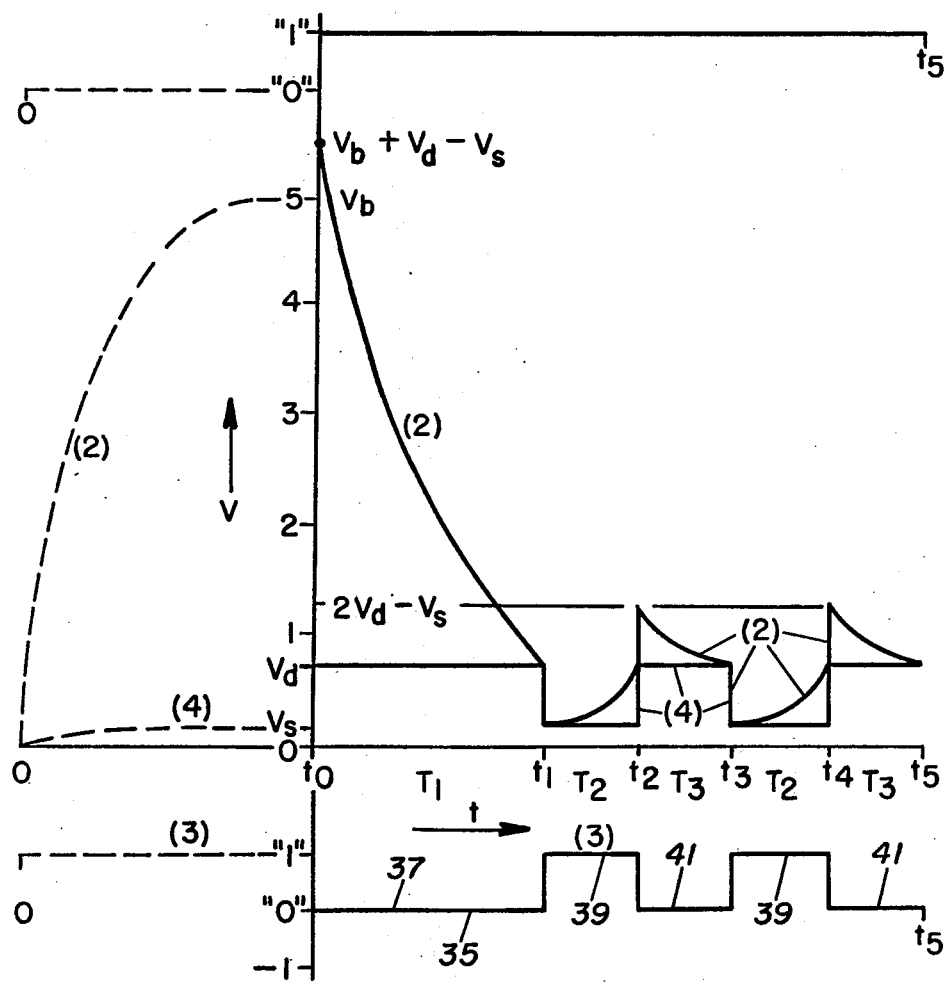

In operation of the oscillator 32 of FIGS. 5 and 6 to produce an output pulse train 35 shown in FIG. 3, a "0" is applied to input 23, point (1), as by a switch connected to ground, when the voltage source $V_s$ is turned on (time $t = 0$ in FIG. 8). This "0" allows current to flow from source $V_s$ through resistor $R_8$ and diode $D_3$ to ground, thus applying a "0" to the base of transistor $Q_5$. The resulting "1" output from $Q_5$, applied to transistor $Q_1$, produces a "0" (or $V_s$) at point (4) and on the left side of capacitor 9 in FIG. 6. The "0" at (4) also blocks transistor $Q_2$, permitting the source $V_s$ to charge point (2) and the right side of capacitor 9, through resistor $R_3$, to $V_b$ (+5v.) making $V_c = V_b - V_s$ (+4.8v).

At a time $t = t_o$, the "0" at point (1) is changed to a "1," as by connecting it to $V_s$. This terminates the current through $R_8$ and diode $D_3$, thus raising the potential applied through $R_8$ and $D_1$ to transistor $Q_5$ to a "1," which switched output (3) to a "0," starting the negative pulse 37 in FIG. 8. The "0" at (3) causes transistor $Q_1$ to raise the potential at point (4) from $V_s$ to $V_d$ (0.7v.) and the capacitor voltage $V_c$ causes the potential at point (2) to go up an equal amount to $V_b + V_d - V_s$ (+5.5v.).

In a time $T_1$, from $t_o$ to $t_1$, point (2) discharges to $V_d$, while point (4) remains at $V_d$ and $V_c$ becomes zero. At point $t_1$, when point (2) drops below $V_d$, transistor $Q_5$ stops conducting, switching output (3) to a "1" (short pulse 30 in FIG. 8) and point (4) to a "0" ($V_s$). Since $V_c = 0$, point (2) also drops to $V_s$. From this point on, the operation of circuit 32 is identical with that of circuit 16 (FIGS. 4 and 7) starting at $t = t_2$, producing the output pulse train 35 made up of a first long negative pulse 37 followed by short positive pulses 39 and intermediate short negative pulses 41.

The time $T_1$ for the long first negative pulse 37 is $$T_1 = R_1 C \log_e \frac{-2(V_b - V_s)}{-2(V_b - V_s) - (V_s - V_b)} = R_1 C \log_e 2.$$

The time $T_2$ for each short position pulse 39 is $$T_2 = R_3 C \log_e \frac{V_b - V_s}{V_b - V_d}.$$

The time $T_3$ for each short negative pulse 41 is $$T_3 = R_1 C \frac{V_b - V_d}{V_b - 2V_d + V_s}.$$

In the example given, $T_1 = 0.693 \, R_1 C$ $T_2 = 0.110 \, R_3 C$ $T_3 = 0.124 \, R_1 C.$ If $R_1 = R_3$, $T_1/T_2 = 6.3$ $T_1/T_3 = 5.6$ $T_2/T_3 = 0.89.$ Thus, the time ratios for the circuit 32 are somewhat lower than those for the circuit 16.

Figure 9:
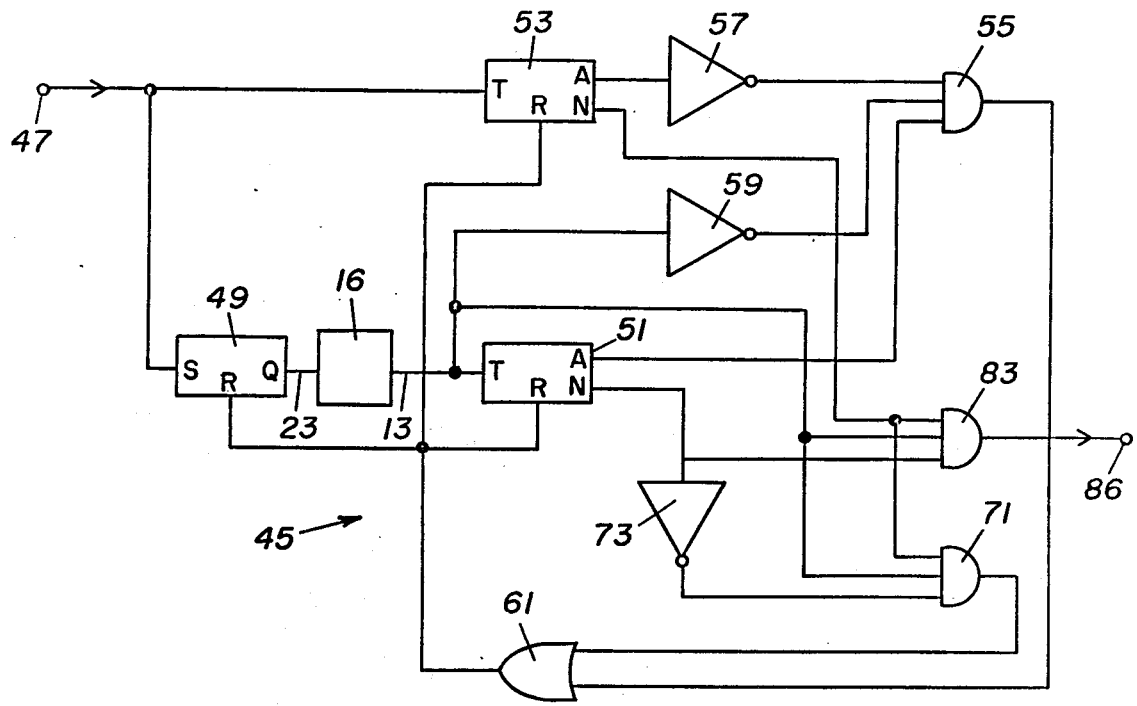
FIG. 9 is a logic circuit diagram of a decoding circuit including the pulse oscillator of FIGS. 3 and 4 and embodying the present invention.

FIG. 9 shows a decoding circuit 45 which includes a gated pulse oscillator adapted to generate a squarewave pulse train having a long positive starting pulse followed by alternate spaces and positive pulses of shorter length, such as the oscillator 16 of FIGS. 3 and 4, in combination with means for comparing the first and Nth pulses of the oscillator pulse train with the first and Nth pulses of a similar incoming signal train, means for rejecting a nonmatching input signal, and means for accepting a matching input signal and producing an output signal, in accordance with the present invention.

The circuit 45 comprises a signal input terminal 47 connected to the SET input S of a flip-flop 49 having its output Q connected to the gate input 23 of the pulse oscillator 16. The output 13 of oscillator 16 is connected to the clock input T of a first digital counter 51, which will be referred to as the "oscillator" counter. Input terminal 47 is also connected directly to a second digital counter 53, which will be referred to as the "signal"

counter. Each of the two counters, which should be as near identical as possible, may be a conventional 4-bit counter having four flip-flops adapted to produce outputs on output channels A, B, C and D at the 1st, 2nd, 4th and 8th counts, respectively. In circuit 45, the output may be taken from the A channel for the first pulse, and from one of channels C and D for the Nth pulse. However, it should be understood that some other count, e.g., 7, could be obtained from channels A to C, by known means.

The A channels of counter 51 and 53 are respectively connected to two inputs of an AND gate 55. The connection between the signal counter 53 and the AND gate includes an inverter 57, so that the counter inputs to the AND gate will be out of phase when the counter outputs are in phase. The AND gate 55 has a third input which is connected, through an inverter 59, to the output 13 of the oscillator 16. The output of AND gate 55 is connected, preferably through an OR gate 61, to the RESETS of the flip-flop 49 and the two counters 51 and 53.

Figure 11:
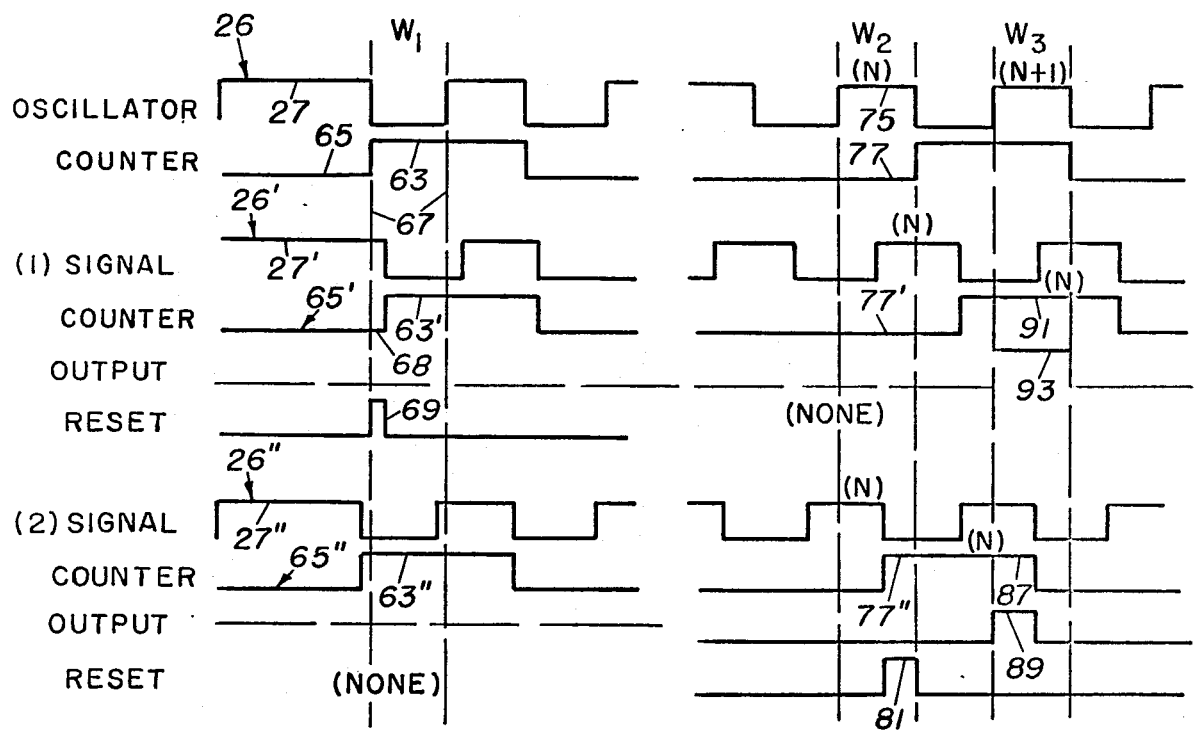
FIGS. 11 and 12 are graphs showing the waveforms associated with various elements in FIGS. 9 and 10, respectively.

In operation, prior to application of a signal pulse train to input terminal 47, the oscillator circuit 16 is energized to the non-oscillating condition shown prior to $t_o$ in FIG. 7, with a "1" applied to the input 23 by flip-flop 49, and the two counters are conditioned to respond to input pulse trains to count pulses. In this condition, the input and outputs of each counter are all "0", the oscillator counter input to gate 55 is a "0," the signal counter input to gate 55 is a "1," and the oscillator input to gate 55 is a "1." Since the inputs to gate 55 are not all "1," the output therefrom is a "0," which does not actuate the RESETS for the flip-flop and counters. The first pulse of the incoming signal train, through the flip-flop 49, starts oscillator 16, producing a corresponding first pulse 27 as shown at (3) in FIG. 7. FIG. 11 shows the oscillator pulse train 26 and first pulse 27, and the signal pulse trains 26' and 26" and first pulses 27' and 27" for two slightly different signals (a) and (b), as a function of time. The counter outputs are "0" during the first pulse. The negative-going portions of the oscillator and signal first pulses cause the two counters to register the first counts, as shown by the first pulse 63 of the oscillator counter train 65 and the first pulses 63' and 63" of the signal oscillator trains 65' and 65". FIG. 11 shows two vertical lines 67 forming a window $W_1$ in the time period between the first and second oscillator pulses (i.e., during the negative portion of the first complete cycle). In this window, the inverter oscillator input to gate 55 is a "1" and the oscillator counter input to gate 55 is also a "1." Since the signal pulse 27' in signal (a) is longer than the oscillator pulse 27, the signal counter output train 65' includes a short "0" portion 68 in the window $W_1$. This "0," inverted by inverter 57, applies a "1" to gate 55, which produces a "1" output, which, in turn, resets the flip-flop 49 and both counters, thus rejecting the first signal pulse 26' as spurious. This is indicated by a short positive reset pulse 69 in FIG. 11. On the other hand, where the first signal pulse 27" is shorter than the first oscillator pulse 27, as shown in signal (b), the first count of the signal counter includes no "0" portion within the window $W_1$, and hence, the difference between the first pulses does not produce a reset.

FIG. 9 further includes means for comparing an Nth pulse of the signal with the Nth pulse of the oscillator, in accordance with the invention. The Nth pulse outputs of the oscillator and signal counters 51 and 53 are connected to two inputs of a second AND gate 71, with an inverter 73 in the oscillator counter connection, and a third input of gate 71 is connected directly to the output 13 of oscillator 16. This produces a RESET window $W_2$ in FIG. 11 (right side) in which the oscillator output 75 is a "1" and the oscillator counter output 77 is a "0," for the Nth pulse, which produce "1" inputs to gate 71. For signal (a) with longer pulses, the signal counter input 77' to gate 71 is a "0," and hence, there would be no reset in the absence of a reset on the first pulse. However, for signal (b) with shorter pulses, the Nth count of the signal counter includes a "1" portion 77" within the window $W_2$, which enables gate 71 and resets the flip-flop and counters. In the event that the first pulse of the signal is not rejected by gate 55, the Nth pulse is not rejected by gate 71, the Nth count produces an output signal from a third AND gate 83 to an output terminal 86. The three inputs of gate 83 are connected directly to the oscillator output 13, the oscillator counter 51 and the signal counter 53, as shown. This produces an output window $W_3$ for the Nth count (which coincides with the $N=1$ pulse of the oscillator 16), in which the oscillator and oscillator counter inputs 84 and 85 to gate 83 are both "1." For signal (b), the Nth signal count includes a "1" portion 87 within window $W_3$, which produces an output pulse 89. If the signal (a) had not been rejected by gate 55, the Nth counter pulse 91 thereof would produce an output pulse 91.

Figure 10:
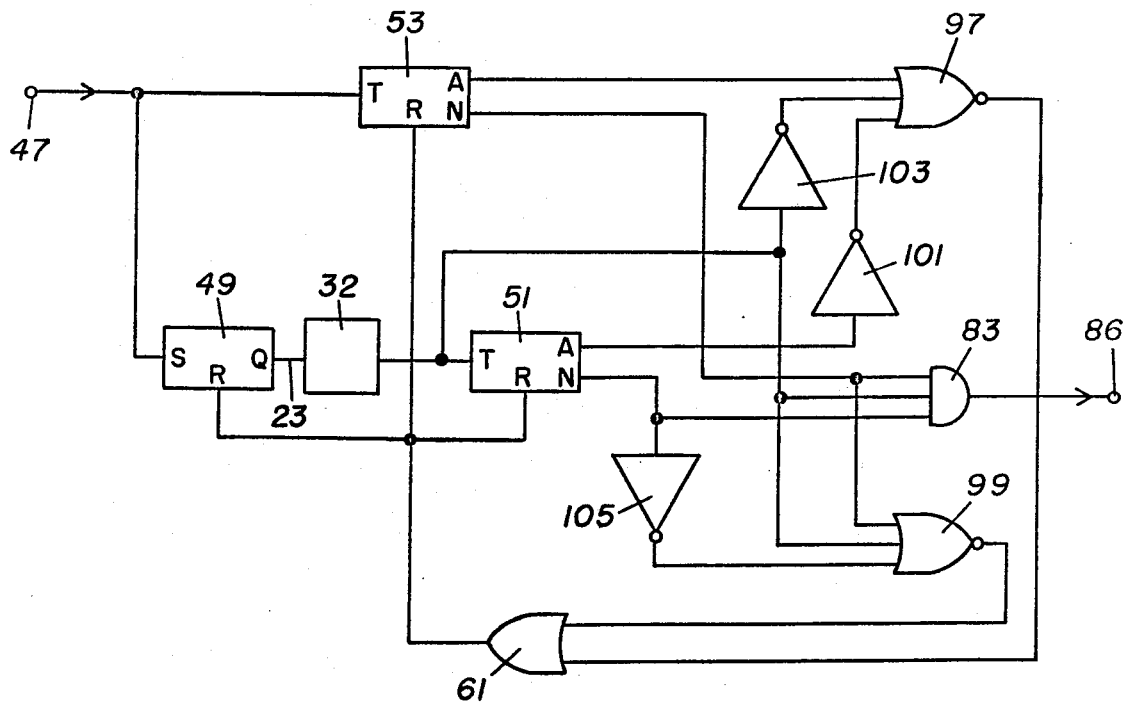
FIG. 10 is a logic circuit diagram of a decoding circuit including the pulse oscillator of FIGS. 5 and 6 and embodying the invention.

FIG. 10 shows a decoding circuit 95 that is similar in function to the circuit 45 of FIG. 9. Circuit 95 includes a gated pulse oscillator, such as oscillator 32 of FIGS. 5 and 6, adapted to generate a square-wave pulse train having a long negative-going or negative first pulse followed by alternate positive and negative pulses of shorter length, such as the pulse train 37 of FIG. 8. The input terminal 47, flip-flop 49, oscillator counter 51, signal counter 53, OR gate 61, output counter 83, and output terminal 86 are the same as in FIG. 9. The AND gates 55 and 71 of FIG. 9 are replaced by NOR gates 97 and 99, respectively. Two inputs of NOR gate 97 are connected, through an inverter 101, to the first pulse output of signal counter 51, and directly to the first pulse output of signal counter 53, respectively. The third input of gate 97 is connected, through an inverter 103, to the oscillator output 13. The NOR gate 99 is connected, through an inverter 105, to the Nth pulse output of oscillator counter 51, and directly to the Nth pulse output of signal counter 53. The third input of gate 99 is connected directly to oscillator output 13.

Figure 12:
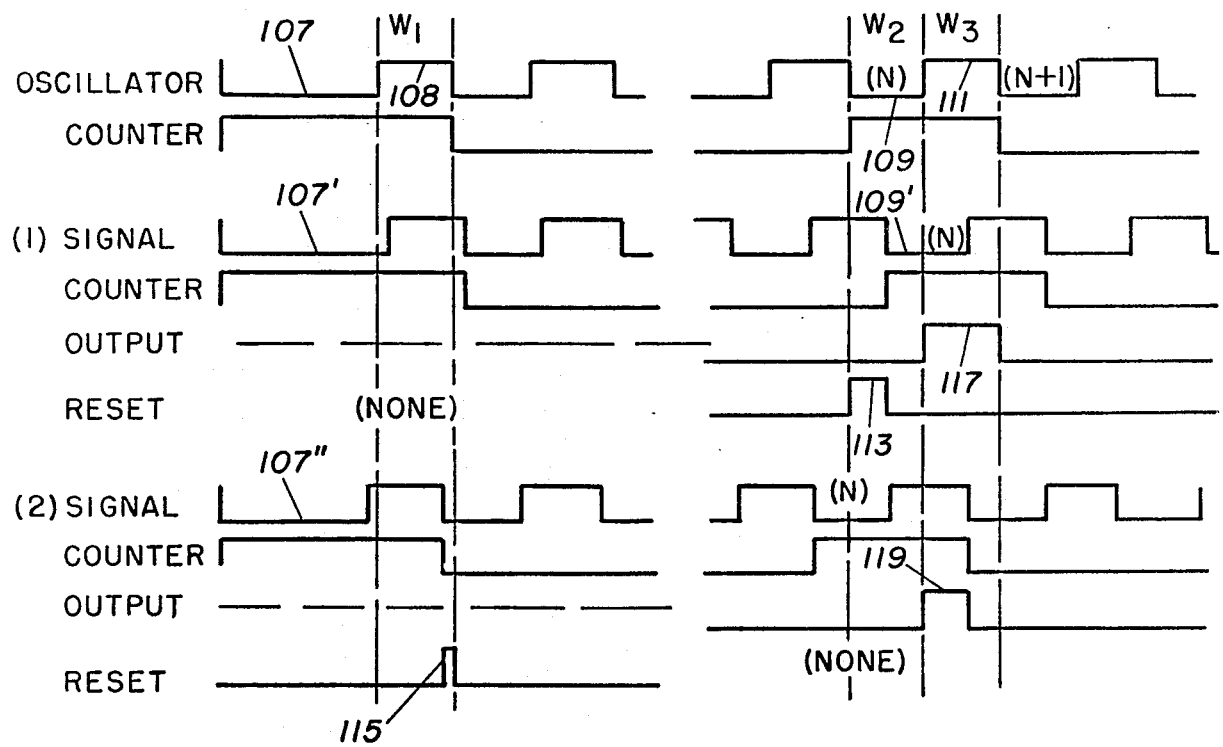

FIG. 12 shows the pulse trains for circuit 95, with a first reset window $W_1$ coextensive with the space 108 following the first negative oscillator pulse 107, a second reset window $W_2$ coextensive with the Nth negative oscillator pulse 109, and an output window $W_3$ coextensive with the next space 111. As shown in FIG. 12, signal (a), with pulses longer than the oscillator pulses, is not rejected at the first signal pulse 107', but is rejected at the Nth signal pulse 109' during a reset pulse 113. On the other hand, signal (b) is rejected at the first signal pulse 107" during a reset pulse 115. Signal train (a), if not rejected at the Nth pulse, would produce an output at terminal 86 during output pulse 117. Signal train (b), if not rejected at the first pulse 107", would produce an output at terminal 86 during output pulse 119.

The foregoing disclosure and drawings are merely illustrative of the principles of this invention and are not to be interpreted in a limiting sense. I wish it to be understood that I do not desire to be limited to the exact details of construction shown and described, because obvious modifications will occur to a person skilled in the art.

What is claimed is:

1. A decoding circuit comprising:
   gated pulse oscillator circuit means responsive to a voltage input to generate a pulse train starting with a first pulse having a given width determined by the electrical characteristics of the oscillator circuit means;
   an input terminal for receiving a signal pulse train for comparison with said generated pulse train;
   a flip-flop having a SET input, a RESET input, and an output; said SET input being connected to said input terminal, and said output being connected to the input of said oscillator circuit means;
   two similar binary counters each including a pulse input, a RESET input, a counting output, and means for producing a logical "1" at its output at the first negative excursion of the pulse train, the pulse input of one of said counters being connected to the output of said oscillator circuit means; and the pulse input of the other counter being connected to said input terminal;
   an electronic gate having three inputs and one output; two of said gate inputs being connected, respectively, in opposite phase to the outputs of said counters; said gate output being connected to the three RESET inputs of said flip-flop and said two counters; and
   means connecting said oscillator circuit means output to the third input of said gate;
   whereby said gate can be activated only by different counter outputs; produced by signal and generated first pulses of unequal width.

2. A decoding circuit as in claim 1, wherein said oscillator circuit means is responsive to a logical "0" input to generate a series of positive pulses; said electronic gate is an AND gate; and the connection between said other counter and said gate includes a phase inverter.

3. A decoding circuit as in claim 1, wherein said oscillator circuit means is responsive to a logical "1" input to generate a series of negative pulses; said electronic gate is a NOR gate; and the connection between said one counter and said gate includes a phase inverter.

4. A decoding circuit as in claim 1, wherein each of said counters further includes a second counting output and means for producing a logical "1" at said second output at the first negative excursion of the pulse train in the Nth pulse thereof, wherein N is any chosen integer greater than 1; and said circuit further comprises:
   a second electronic gate having three inputs and one output; two of said inputs being connected, respectively, in opposite phase to said second outputs of said counters; the third input being connwcted to the output of said oscillator circuit means; said output being connected to said RESET inputs of said flip-flop and said counters; and
   whereby said second gate can be activated only by different counter outputs produced by signal and generated Nth pulses of unequal width and/or phase.

5. A decoding circuit as in claim 4, wherein said oscillator circuit means comprises:
   two inverters and an inverting electronic gate having two inputs and one output, connected in series, with the output of the first inverter connected to the input of the second inverter, the output of the second inverter connected to one input of said gate, and the output of said gate connected to the input of the first inverter; and
   a capacitor in parallel with the second inverter;
   the electrical characteristics of said oscillator circuit means being such that a voltage applied to the other input of said gate will cause the circuit to generate a coded pulse train made up of a first pulse having a given width followed by a series of similar pulses having a width and spacing small compared to said given width.

6. A decoding circuit as in claim 4, wherein
   said oscillator circuit means is responsive to a logical "0" input to generate a series of positive pulses;
   said second gate is an AND gate; and
   said inverter is in the connection between said second gate and said one counter.

7. A decoding circuit as in claim 4, further comprising:
   an output terminal; and
   a third electronic gate having three inputs and one output; two of said inputs being connected, respectively, to said second outputs of said counters; the third input being connected to the output of said oscillator circuit means; and said output being connected to said output terminal, whereby a logical "1" is produced at said output terminal when both counters produce the same kind of output in response to the Nth pulses of said signal and generated pulse trains.

8. A decoding circuit as in claim 7, wherein said oscillator circuit means comprises:
   two inverters and an inverting electronic gate having two inputs and one output, connected in series, with the output of the first inverter connected to the input of the second inverter, the output of the second inverter connected to one input of said gate, and the output of said gate connected to the input of the first inverter; and
   a capacitor in parallel with the second inverter;
   the electrical characteristics of said oscillator circuit means being such that a voltage applied to the other input of said gate will cause the circuit to generate a coded pulse train made up of a first pulse having a given width followed by a series of similar pulses having a width and spacing small compared to said given width.

9. A decoding circuit as in claim 7, wherein:
   said oscillator circuit means is responsive to a logical "0" input to generate a series of positive pulses; and
   said third gate is an AND gate.

10. A decoding circuit as in claim 4, wherein the connections between said first and second gates and said RESET inputs include an OR gate.

* * * * *